United States Patent
Watanabe (10) Patent No.: US 6,448,866 B1
(45) Date of Patent: *Sep. 10, 2002

(54) MICROWAVE SEMICONDUCTOR VARIABLE ATTENUATION CIRCUIT

(75) Inventor: Shigeru Watanabe, Tokyo (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/418,020

(22) Filed: Oct. 14, 1999

(30) Foreign Application Priority Data

Oct. 19, 1998 (JP) .......................... 10-296435

(51) Int. Cl.[7] ................................. H01P 1/22
(52) U.S. Cl. ..................... 333/81 R; 333/117; 333/109
(58) Field of Search ............... 333/81 R, 117, 333/156, 164, 109, 115; 327/237

(56) References Cited

U.S. PATENT DOCUMENTS 4,216,445 A * 8/1980 Abajian .................... 333/81 R
4,837,530 A * 6/1989 Kondoh .................... 333/81 A

OTHER PUBLICATIONS

H. A. Watson, Editor, "Microwave Semiconductor Devices and their Applications", Microwave Switches, Limiters and Phase Shifters, 1969, pp. 322–325.

* cited by examiner

*Primary Examiner*—Robert Pascal
*Assistant Examiner*—Stephen E. Jones
(74) *Attorney, Agent, or Firm*—Oblon, Spivak, McClelland, Maier & Neustadt, P.C.

(57) ABSTRACT

Microwave semiconductor variable attenuation circuit includes a coupler, two series circuits of inductors and a plurality of means having controllable resistance. Each Inductor of the series circuits has a defined inductance, where one end of the series circuit is connected to a terminal of the coupler. Each of means having controllable resistance respectively being connected to a junction point between two respective inductors of the series circuit. All of means having controllable resistance are controlled on the basis of a common signal is provided at a single terminal. By the above features provided that inductors of defined inductance between the coupler and the means having controllable resistance (e.g. a transistor or diode), the total impedance of the attenuation circuit can be properly set and a performance degradation at high frequency can be avoided.

12 Claims, 10 Drawing Sheets

MICROWAVE SEMICONDUCTOR VARIABLE ATTENUATION CIRCUIT

BACKGROUND OF THE INVENTION

This invention relates to the variable attenuation circuit used for microwave communication device, for example. Microwave communication device is controlling high frequency characteristics, such as a power gain of apparatus and an output power level by using the variable attenuation circuit. As an attenuation circuit, a variable resistor network linked to the T type or I type is constituted, and a diode or a field effect transistor is used as a variable resistor.

However, it is necessary for realizing desired attenuation and desired impedance to decide each resistance of the variable resistor connected in series in parallel as any resistance according to attenuation, when above attenuation circuit is used, and the control circuit setting up resistor of a variable resistance becomes complicated.

Figure 1:
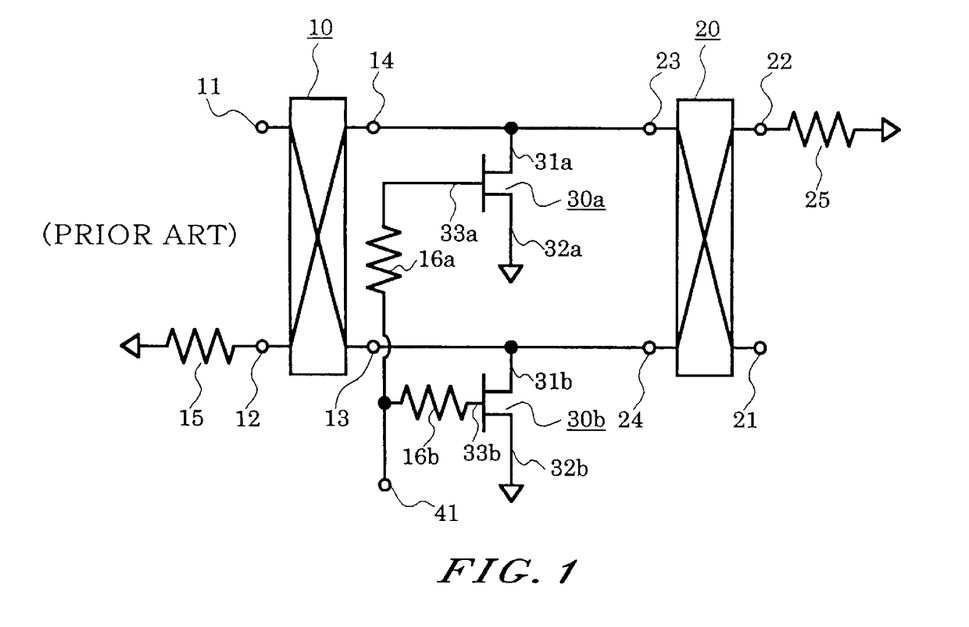
FIG. 1 is a circuit diagram of a variable attenuator according to the prior art.
Figure 2:
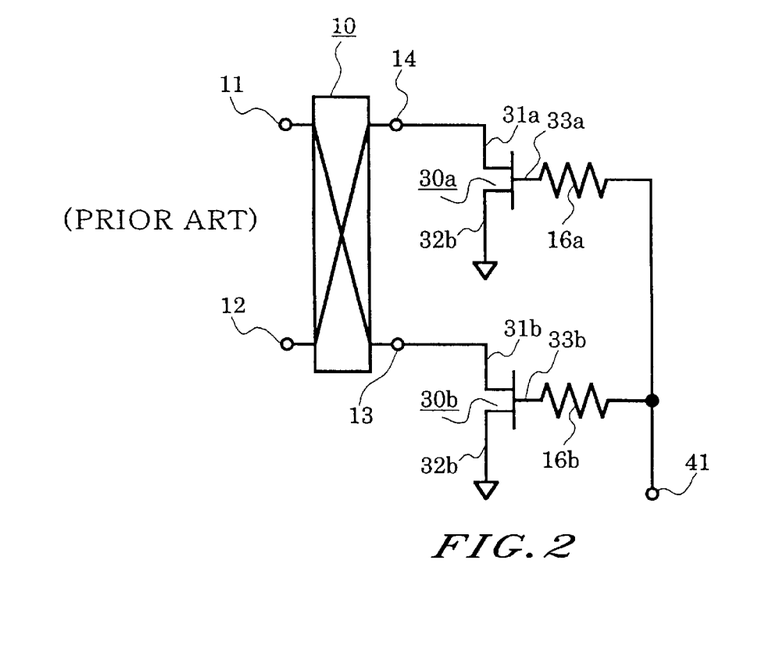
FIG. 2 is a circuit diagram of a variable attenuator according to the prior art.

Therefore, a circuit using the directivity coupler shown in FIG. 1 or FIG. 2 is used much as a circuit of microwave.

Referring now to the attenuation circuit shown in FIG. 1, a passage terminal 13, and a coupling terminal 14 of a first directional coupler 10 connect to a coupling terminal 24, and a passage terminal 23 of a second directional coupler 20 respectively. Field-Effect-Transistor (FET) 30a, 30b are connected in parallel between the passage terminal 13 and the coupling terminal 24, and the coupling terminal 14 and the passage terminal 23 respectively. An input terminal 11 of the first directional coupler 10, and an input terminal 21 of the second directional coupler 20 are a signal input, and a signal output of this attenuation circuit respectively. And isolation terminals 12 and 22 of respective directional couplers 10 and 20 terminate in termination resistors 15 and 25 respectively.

Signals inputted from the input terminal 11 as signal input are distributed to the passage terminal 13 and coupling terminal 14 by first directional coupler 10. After passing through the parallel circuit of the FETs 30a and 30b, the distributed signals are inputted into the coupling terminal 24 and the passage terminal 23 of the second directional coupler 20 respectively, is compounded, and is outputted from the input terminal 21 of the second directional coupler 20 as signal output. FET 30a and 30b that voltage between drain 31a, 31b and source 32a, 32b is 0 [V] are used as variable resistor by gate bias provided for gate 33a, 33b through resistor 16a, 16b from control terminal 41. The power absorbed by FET 30a and 30b is changed, passage loss is controlled according to changing the resistance of FET 30a and 30b compared with the characteristic impedance (for example, 50 [Ω]) of a directional coupler, as a result, the variable attenuation circuit is realized with it.

Moreover, Since the reflective power produced by the mismatching with the impedance of FET and the characteristic impedance of a directional coupler is absorbed by the terminus resistance 15 connected to the isolation terminal 12, it can realize a matching state without returning to the input terminal 11.

Next referring now to the attenuation circuit shown in FIG. 2, this circuit uses the mismatching with impedance of the directional coupler 10 and FET 30a or 30b. And, as a result, a variable attenuation circuit is realized by compounding the reflected signal, making it output from the isolation terminal 12, changing the impedance of FET 30a and 30b, and controlling reflection.

Therefore, in the variable attenuation circuit using the directional coupler, the matching state is realized by using only gate bias of FET connected in parallel as control voltage, and using the character of a directional coupler. In the circuit shown in FIG. 1 as mentioned above, in order to obtain the desired attenuation, the resistance of variable resistor, such as FET, is changed.

However, since reactance component of the impedance by influence of the parasitic capacity of FET or a parasitic inductance becomes large According frequency becomes high, even if gate bias changes, it is not able to change enough in the impedance of FET.

Figure 3:
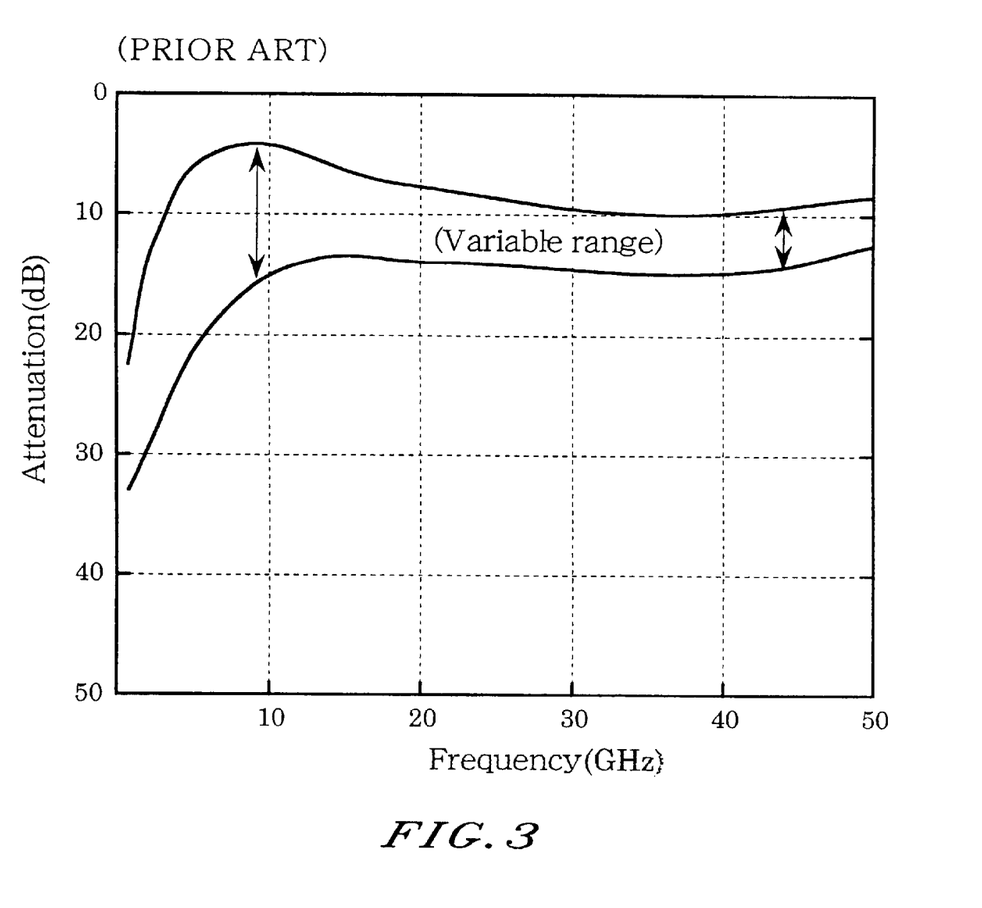
FIG. 3 is a passage characteristic diagram of a variable attenuator according to the prior art.

Referring now to FIG. 3, FIG. 3 is a passage characteristic diagram of the variable attenuator in consideration of parasitic capacity of FET. FIG. 3 shows the passage characteristic of the case, for example, in the composition of FIG. 1, used High-Electron-Mobility-Transistor (HEMT) that gate length is 0.3 micrometers and gate width is 300 micrometers. Moreover, it uses four fingers Lange couplers of main frequency 25 GHz as directional coupler. There is a problem that the variable range becomes small remarkably, in high frequency domain, as passage loss becomes large.

Accordingly, it is an object of the present invention to provide a microwave variable attenuation circuit. in the variable attenuation circuit using a coupler, preventing increase of the passage loss and decrease of the variable attenuation by the parasitic capacity of a variable resistor, and having good transmission characteristic.

DESCRIPTION OF THE PREFERRED EMBODIMENTS

This invention will be described in further detail with reference to the accompanying drawings.

(First Embodiment)

Figure 4:
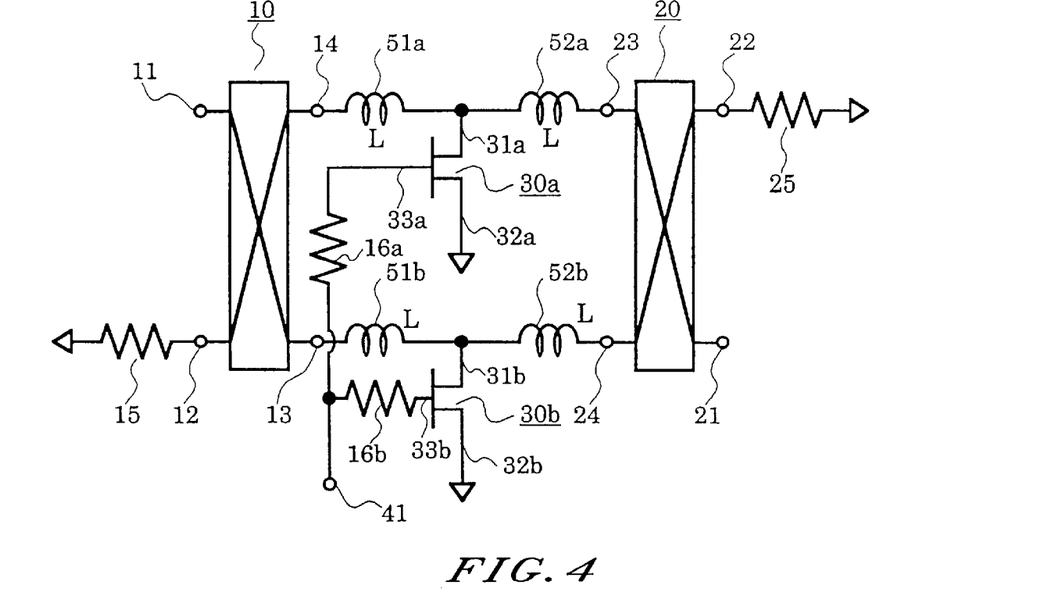
FIG. 4 is a circuit diagram of first embodiment of a variable attenuator according to the present invention.

Referring now to FIG. 4, there is shown a variable attenuator circuit using Field-Effect-Transistors (referred to as FET below).

Inductors 51a, 51b, 52a, and 52b are respectively equal inductance, the inductors 51a and 52a are connected in series to a passage terminal 13 of first directional coupler 10 (for example, 3dB directional coupler) and a coupling terminals 24 of second directional coupler 20, and the inductors 51b and 52b are connected in series to a coupling terminal 14 of first directional coupler 10 and a passage terminal 23 of second directional coupler 20. Drain terminals 31a and 31b of FET 30a and 30b are respectively connected to connection parts of the inductors 51a and 52a and inductors 51b and 52b, gate terminals 33a and 33b connect to the control terminal 41 through resistors 16a and 16b, and source terminals 32a and 32b are grounded. Moreover, in this circuit, an input terminal 11 of the first directional coupler 10 is as a signal input, an input terminal 21 of the second directional coupler 20 is as a signal output, and isolation terminals 12 and 22 of directional couplers 10 and 20 terminate termination resistors 15 and 25 respectively.

Figure 5A:
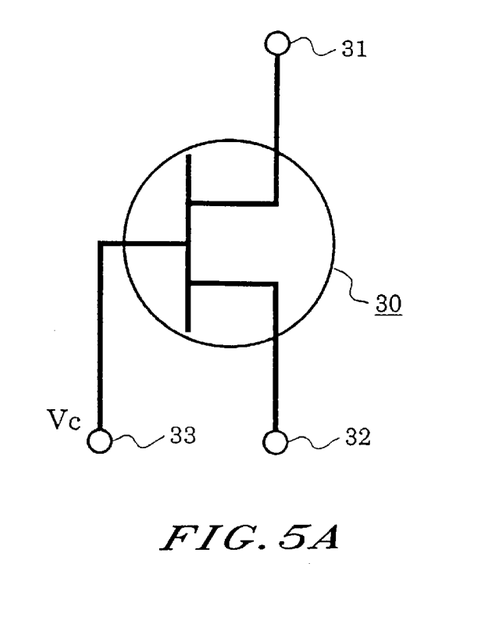
FIGS. 5a and 5b are an equivalent circuit diagram of a Field-Effect-Transistor.
Figure 5B:
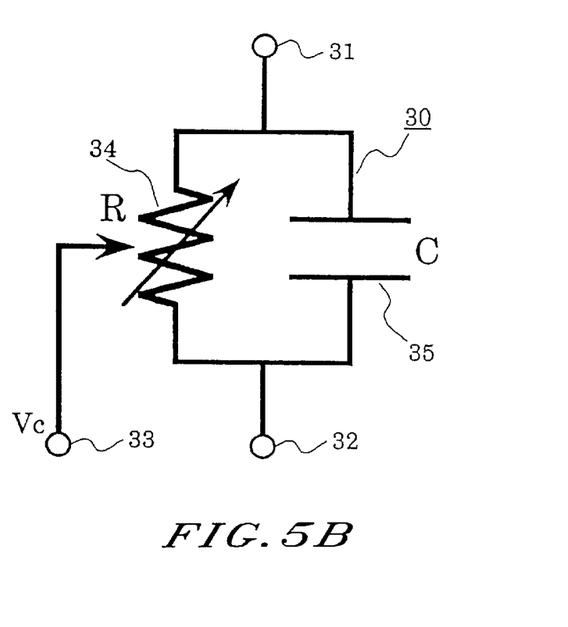

By the way, an equivalent circuit of FET 30 (Both 30a and 30b) in FIG. 5 (a) is shown a parallel circuit having a variable resistor 34 controlled by control voltage $V_c$ and a parasitic capacitor (capacity C) in FIG.5 (b). In present invention, when the characteristic impedance of directional couplers 10 and 20 is $Z_0$, the inductance C of the inductors 51a, 52a, 51b, and 52b is defined by equation 1.

$$Z_0^2 = 2L/C \quad (1)$$

A signal inputted from the signal input (the input terminal 11) is distributed by the first directional coupler 10 to the passage terminal 13 and the coupling terminal 14, distributed signals are passing through the parallel circuits of FET 30a and 30b through the inductors 51a, 52a and inductors 51b, 52b, the distributed signals are inputted into the coupling terminal 24 and the passage terminal 23 of the second directional coupler 20 respectively, and a signal is outputted from the signal output (the input terminal 21). The power absorbed by the FETs 30a and 30b is changed, passage loss is controlled according to changing the resistance of the FETs 30a and 30b controlled by voltage impressed to the control terminal 41, as a result, this variable attenuation circuit is realized with it. Moreover, since the reflective power produced by the mismatching with the impedance of FET 30 and the characteristic impedance of directional couplers 10, 20 is absorbed by the termination resistor 15 connected to the isolation terminal 12, it can realize a matching state without returning to the input terminal 11.

Accordingly, since inductance L of the inductors 51a, 52a, 51b, and 52b satisfy Formula 1, a parallel circuit can be regarded as a circuit comprising a transmission line with same characteristic impedance as the directional couplers 10, 20 and a variable resistor. Thus since the impedance by the influence of the parasitic capacity 35 of the FET 30 can be made small in high frequency domain, the variable range of attenuation increases as the passage loss decreases.

Figure 6:
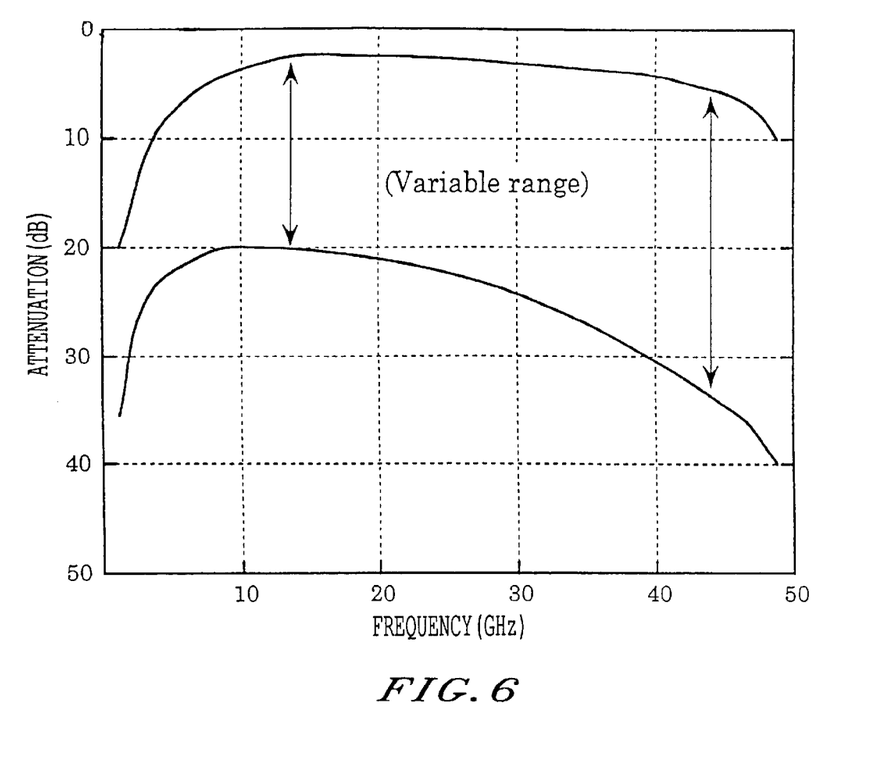
FIG. 6 is a passage characteristic diagram of variable attenuator according to the present invention.

Referring now to FIG. 6, there is shown a passage characteristic drawing of variable attenuator. Compared with FIG. 6 of the prior art, the passage loss is small, the variable range is large, and the frequency band which can be used as an attenuator becomes large.

(Second Embodiment)

Figure 7:
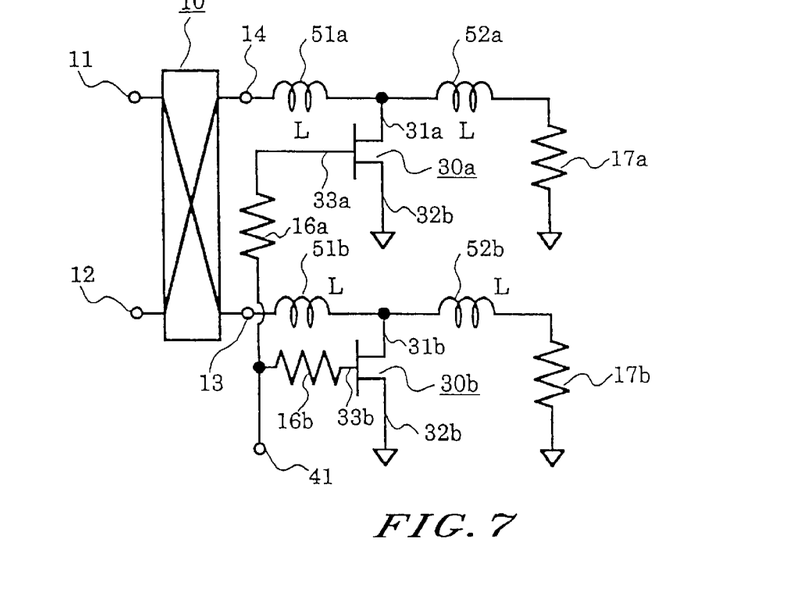
FIG. 7 is a circuit diagram of second embodiment of a variable attenuator according to the present invention.

Referring now to second embodiment of the present invention shown in FIG. 7, the same part as FIG. 7 is shown in the same mark. A coupling terminal 14 and a passage terminal 13 of a directional coupler 10 are connected to ends of in-series circuits which connected in-series to inductors 51a and 52a, and inductors 51b and 52b, respectively. Another ends of in-series circuits connect termination resistors 17a and 17b, respectively. Inductance of the inductors 51a and 52a, and inductors 51b and 52b is equal respectively, connection parts of the inductors 51a and 52a, and inductors 51b and 52b are connected to drain terminals 31a and 31b of FET 30, and source terminals 32a and 32b of FET 30 are grounded. A control terminal is connected to gate terminals 32a and 32b of FET 30 through resistors 16a and 16b, and FET 30a and 30b are controlled by voltage impressed to the control terminal 41. Accordingly, reflected signals are outputted from a isolation terminal 12 by using mismatching with impedance of the directional coupler 10 and FET 30, and it is realized a variable attenuation circuit to control reflection by changing impedance of FET 30.

In above variable attenuation circuit, there is the same effect as description of first embodiment. Since inductors 51a and 52a, and inductor 51b and 52b of second embodiment also satisfy Formula 1, the passage loss of a reflective signal decreases in a high frequency domain, the variable range of attenuation can enlarge, and the frequency range which can use as an attenuator becomes large.

(Third and Fourth Embodiments)

The present invention is embodied the variable attenuation circuit used the diode instead of FET, but the attenuation variable circuit used FET as a variable resistor is explained in above first and second embodiments.

Figure 8:
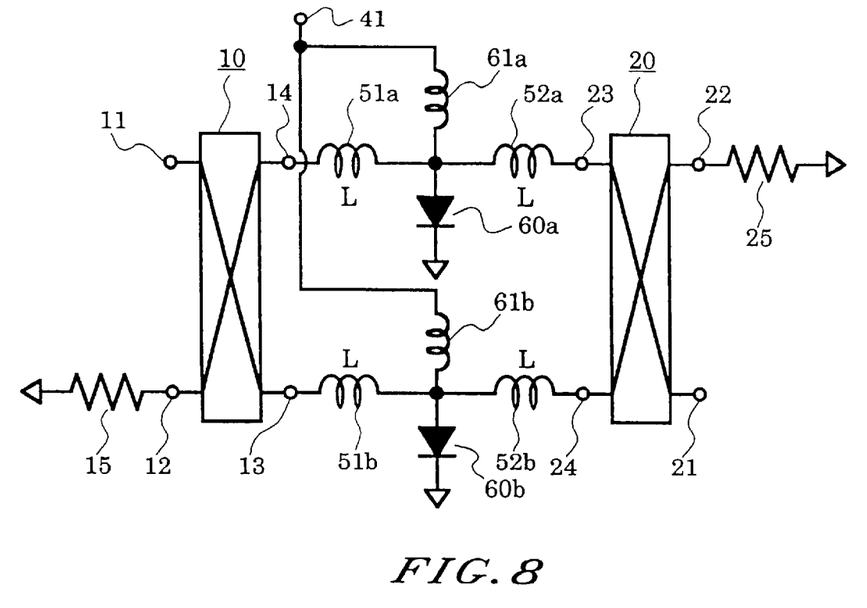
FIG. 8 is a circuit diagram of third embodiment of a variable attenuator according to the present invention.
Figure 9:
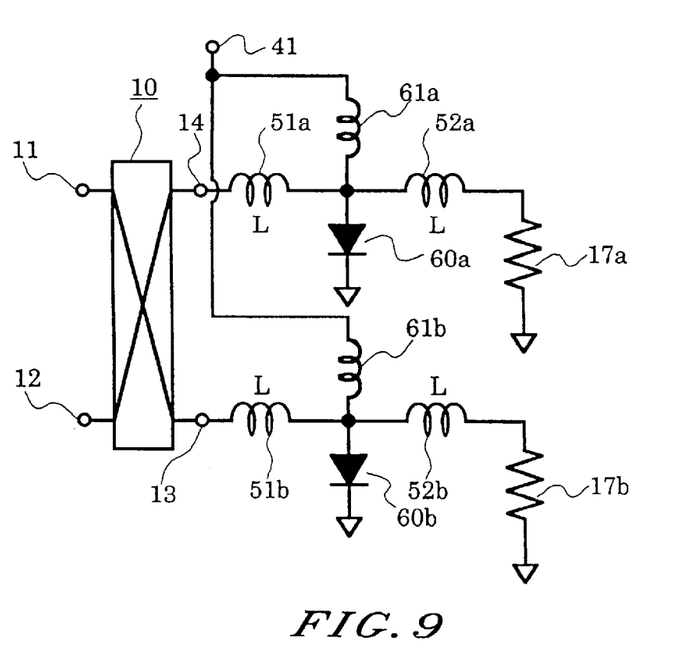
FIG. 9 is a circuit diagram of fourth embodiment of a variable attenuator according to the present invention.

Referring now to FIG. 8 and FIG. 9 of third and fourth embodiments, diodes 60a and 60b are used instead of FET 30a and 30b of FIG. 4 or FIG. 7. Anode terminals of diodes 60a and 60b connect to connection parts of inductors 51a and 52a, and inductor 51b and 52b respectively, and cathode terminals of 60a and 60b are grounded. One ends of choke coils 61a and 61b connect anode terminals of diodes 60a and 60b respectively, another ends connect control terminal 41. Moreover, resistance of diodes 60a and 60b are controlled by voltage impressed to choke coil 61a and 61b (control terminal 41).

Accordingly, since inductance L of inductor 51a, 52a, 51b, and 52b and connecting capacity $C_p$ of diode 60a and 60b are decided as satisfy Formula. 2, the passage loss of a reflective signal decreases in a high frequency domain, the variable range of attenuation can enlarge, and the frequency range which can use as an attenuator becomes large.

$$Z_0^2 = 2L/C_p \quad (2)$$

(Fifth Embodiment)

Figure 10:
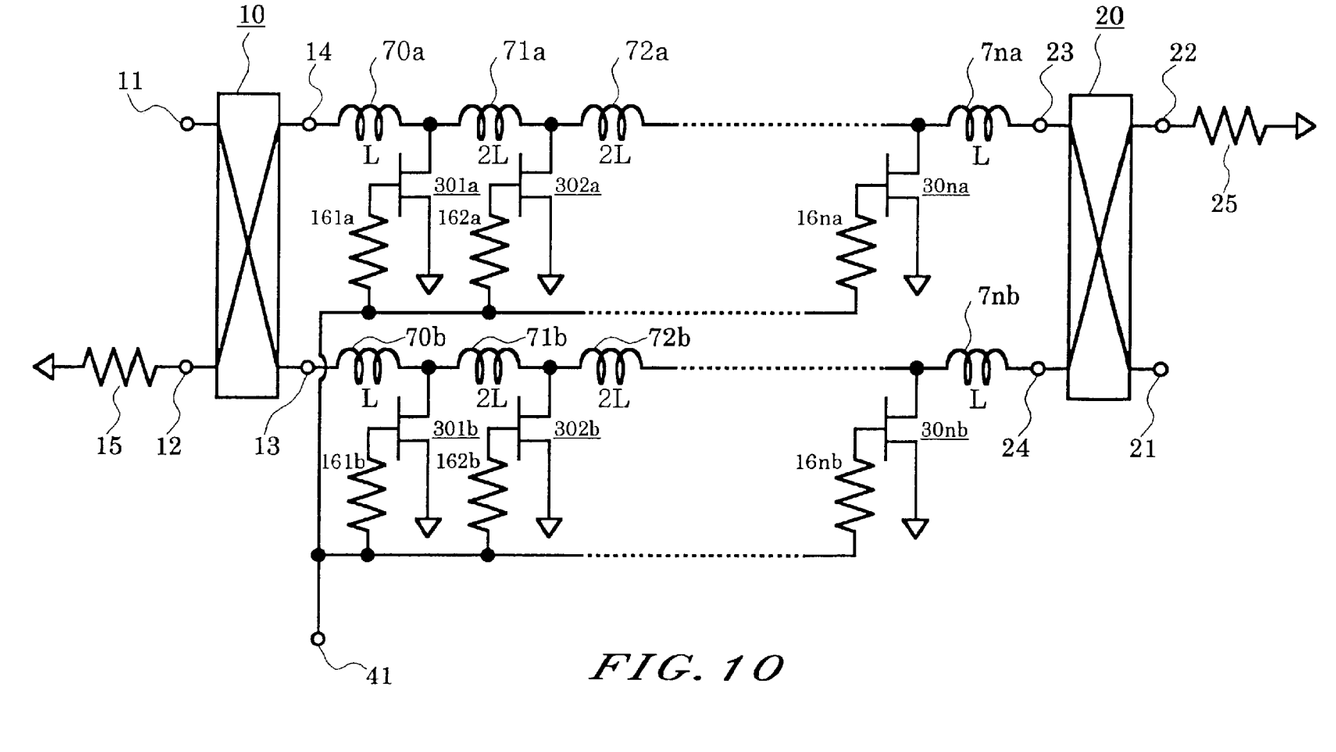
FIG. 10 is a circuit diagram of fifth embodiment of a variable attenuator according to the present invention.

Referring now to FIG. 10 of fifth embodiment, ends of first and second ladder type circuits are connected to a coupling terminal 14 and a passage terminal 13 of the first directional coupler respectively, and another ends are connected a passage terminal 23 and coupling terminals 24 of the second directional coupler respectively. A First ladder type circuit is in-series circuit connected in-series to inductors 70a–7na (natural numbers of arbitrary n) of at least two or more, and drain terminals of FET 301a–30na are connected to each connecting point of inductors 70a–7na respectively. A Second ladder type circuit is also in-series circuit connected in-series to inductors 70b–7nb of at least two or more, and drain terminals of FET 301b–30nb are connected to each connecting point of inductors 70b–7nb respectively. All of source terminals of FET 301a–30na and FET 301b–30nb are grounded, and gate terminals of FET 301a–30na and FET 301b–30nb are connected to a control terminal 41 through resistor 161a–16na and resistor 161b–16nb respectively. When characteristic impedance of directional couplers 10 and 20 are $Z_0$ respectively and each parasitic capacity of FET 301a–30na and FET 301b–30nb is C, inductors 70a, 7na, 70b, and 7nb set as inductance L, and other inductors set as inductance 2L. These characteristic impedance $Z_0$, parasitic capacity C, and inductance L, 2L satisfy Formula.1.

Figure 11:
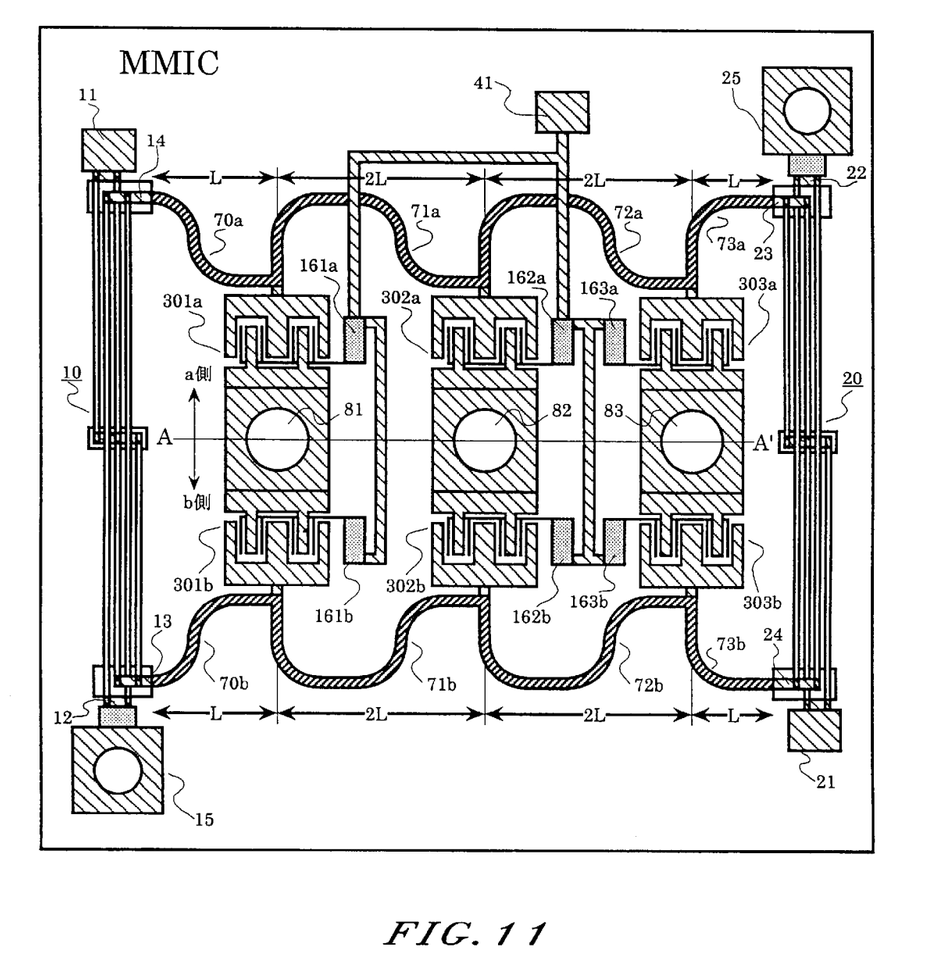
FIG. 11 is a monolithic microwave integrated circuit diagram of fifth embodiment of a variable attenuator according to the present invention.

Moreover, referring now to FIG. 11 of fifth embodiment, there is shown a Monolithic Microwave Integrated Circuit (MMIC) formed on a half-insulation semiconductor board. MMIC in FIG. 11 shows the case where n is three, source terminals of FET 301a and 301b, FET 302a and 302b, and FET 303a and 303b are connected to common through holes 81–83 respectively, and the common through holes 81–83 are grounded. FET and through holes of MMIC are symmetrical with a line A–A' passing through the through holes 81–83 by a and b side.

Accordingly, in above variable attenuation circuit, the passage loss of a reflective signal decreases in a high frequency domain, the variable range of attenuation can be enlarged, and the frequency ranges which can use as an attenuator becomes large. Since number of components of MMIC can be reduced by communalizing through holes 81–83, the size of MMIC can become small. And since FET of MMIC is set up symmetry, characteristic of the whole attenuator is improved.

Moreover, since each FET can be set up small by using two or more FET, parasitic capacity and inductance of inductors become small. Therefore as the whole circuit, the variable range of attenuation can be enlarged according as the minimum insertion loss can become smaller.

(Sixth Embodiment)

Figure 12:
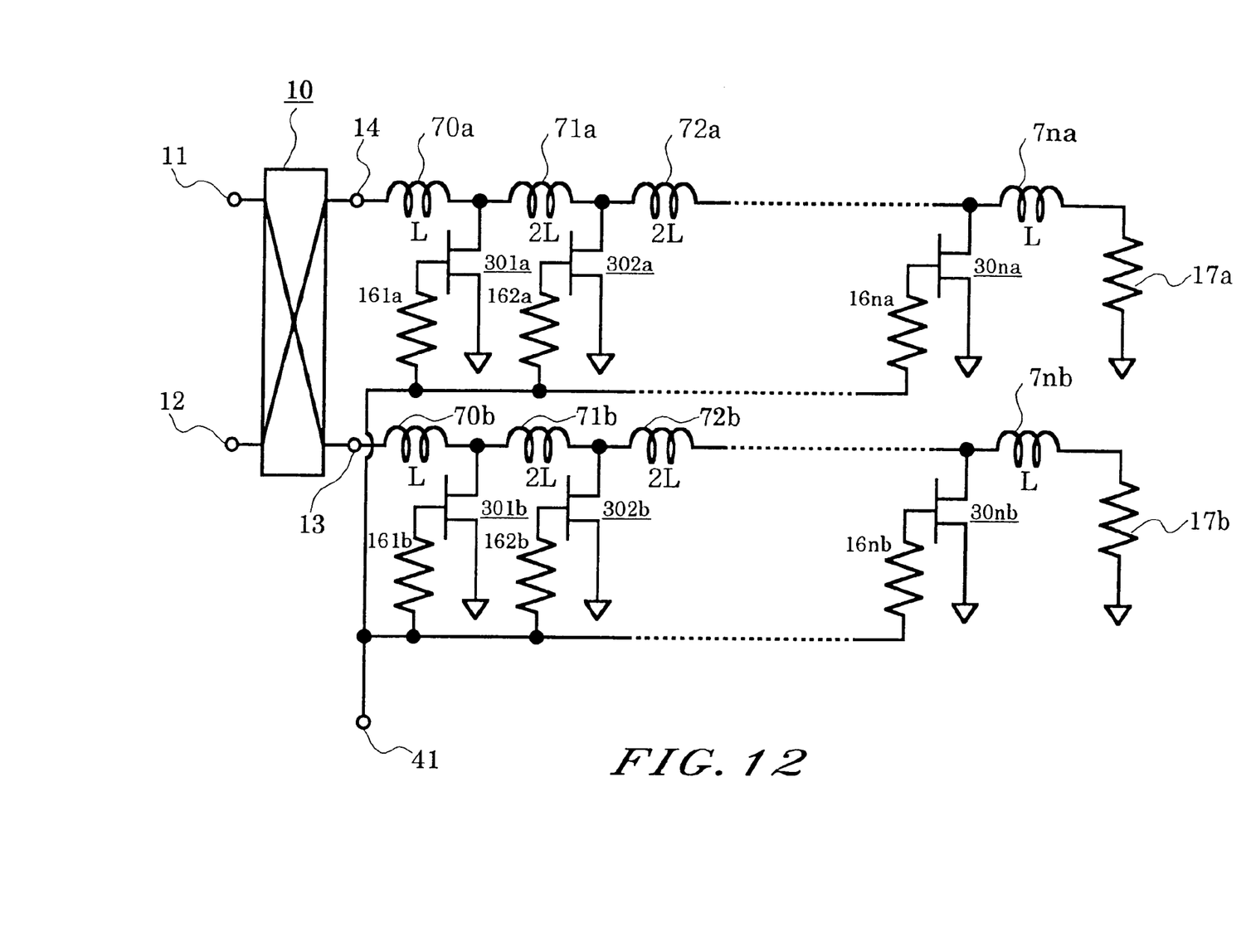
FIG. 12 is a circuit diagram of sixth embodiment of a variable attenuator according to the present invention.

Referring now to sixth embodiment of the present invention shown in FIG. 12, ends of first and second ladder type circuits are connected to a coupling terminal 14 and a passage terminal 13 of the first directional coupler respectively, and another ends are connected to termination resistors 17a and 17b. The first ladder type circuit is an in-series circuit connected in-series to inductors 70a–7na of at least two or more, and drain terminals of FET 301a–30na are connected to each connecting point of inductors 70a–7na respectively. The second ladder type circuit is also an in-series circuit connected in-series to inductors 70b–7nb of at least two or more, and drain terminals of FET 301b–30nb are connected to each connecting point of inductors 70b–7nb respectively. All of source terminals of FET 301a–30na and FET 301b–30nb are grounded, and gate terminals of FET 301a–30na and FET 301b–30nb are connected to a control terminal 41 through resistor 161a–16na and resistor 161b–16nb respectively. When characteristic impedance of directional couplers 10 is $Z_0$ and each parasitic capacity of FET 301a–30na and FET 301b–30nb is C, inductors 70a, 7na, 70b, and 7nb set as inductance L, and other inductors set as inductance 2L. These characteristic impedance $Z_0$, parasitic capacity C, and inductance L, 2L satisfy Formula. 1.

In above variable attenuation circuit, reflected signals are outputted from a isolation terminal 12 by using mismatching with impedance of the directional coupler 10 and FET 301a–30na, 301b–30nb, and it is realized a variable attenuation circuit to control reflection by changing impedance of FET 301a–30na, 301b– 30nb.

Moreover, when the circuit of this embodiment forms as MMIC as shown in FIG. 11, the common through hole is not connected to only the gate terminal of FET but also the termination resistor. In this embodiment, FET and through holes of MMIC are also symmetrical with a passing line through the through holes.

Accordingly, since number of components of MMIC can be reduced by communalizing through holes. the size of MMIC can become small. And since the FET of the MMIC is set up symmetry, characteristic of the whole attenuator is improved.

Moreover, since each FET can be set up small by using two or more FET, parasitic capacity and inductance of inductors become small. Therefore for the whole circuit, the minimum insertion loss can become smaller, and the variable range of attenuation can be enlarged.

(Seventh and Eighth Embodiments)

Figure 13:
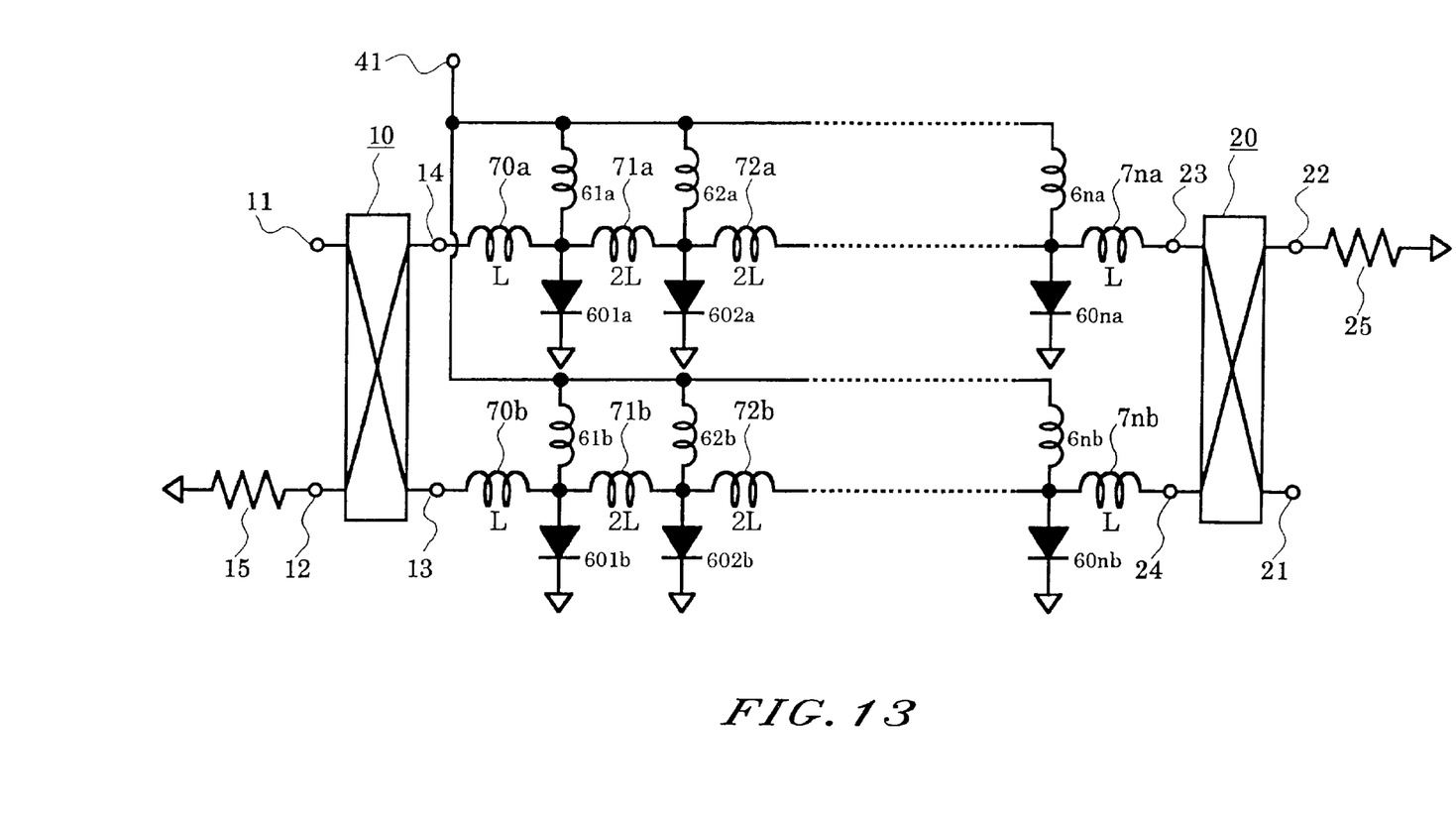
FIG. 13 is a circuit diagram of seventh embodiment of a variable attenuator according to the present invention.
Figure 14:
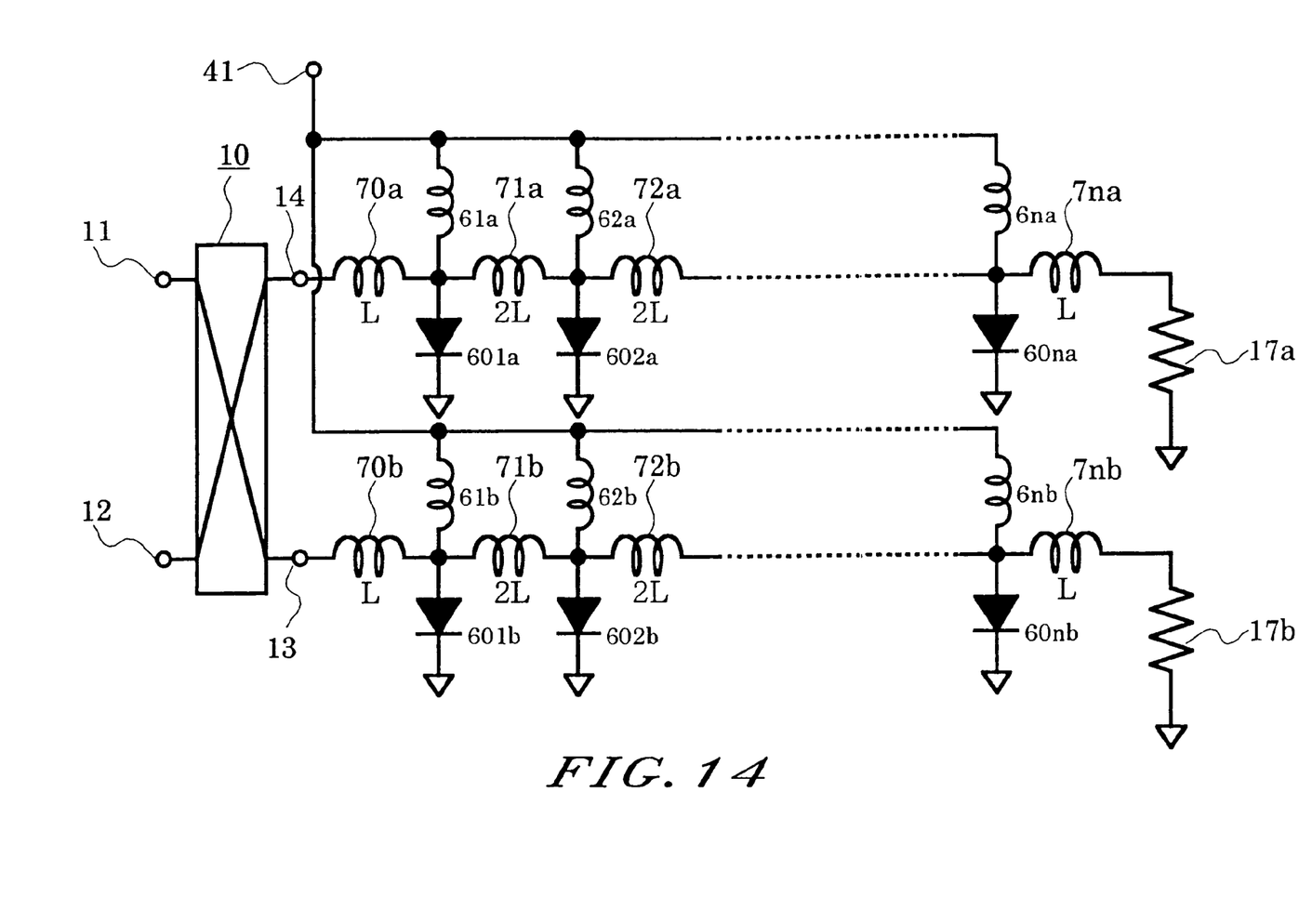
FIG. 14 is a circuit diagram of eighth embodiment of a variable attenuator according to the present invention.

Referring now to FIG. 13 and FIG. 14, seventh and eighth embodiments of the present invention use diodes 601a–60na, 601b–60nb instead of FET 301a–30na, 301b–30nb used fifth and sixth embodiments shown in FIG. 10 and FIG. 12. The resistance of the diodes is controlled by voltage impressed to Choke coils 61a–16na, 61b–6nb connected to anode terminals of the diode. When characteristic impedance of the directional couplers is $Z_0$ and each connection capacity of the diode is $C_p$, inductors 70a, 7na, 70b, and 7nb set as inductance L, and other inductors set as inductance 2L.

In above embodiments like the fifth and sixth embodiments, the passage loss of a reflective signal decreases in a high frequency domain, the variable range of attenuation can be enlarged, and the frequency range that can use as an attenuator becomes large. When these embodiments form MMIC like FIG. 11, the size of MMIC can reduce by using common through holes. Since diodes of MMIC are set up symmetry, characteristic of the whole attenuator is improved.

Accordingly, since each diode can be set up small by using two or more diodes, connection capacity of the diode and inductance of the inductor become small. Therefore as the whole circuit, the minimum insertion loss can be reduce, and the variable range of attenuation can be enlarged.

What is claimed is:

1. A circuit for the variable attenuation of microwave signals, comprising:

a first coupler;

a second coupler;

a first series circuit of inductors, each inductor having a defined inductance, where one end of said first series circuit is connected to a first terminal of said first coupler, and the other end of said first series circuit is connected to a first terminal of said second coupler;

a second series circuit of inductors, each inductor having a defined inductance, where one end of said second series circuit is connected to a second terminal of said first coupler, and the other end of said second series circuit is connected to a second terminal of said second coupler;

a plurality of controllable resistance means, each being connected to a junction point between two respective inductors of said first or second series circuit; and inductors at the ends of said first and second series circuits having a predetermined inductance represented as L, the remaining inductors having an inductance 2L, and said first and second series circuits satisfying $Z_0^2 = 2L/C$, where the characteristic impedance of said first coupler is represented as $Z_0$, and the capacity of said controllable resistance means is represented as C.

2. A circuit according to claim 1, wherein said second coupler has an impedance equal to the impedance of said first coupler.

3. A circuit according to claim 1, wherein said controllable resistance means is a field-effect-transistor.

4. A circuit according to claim 3, wherein said second coupler has an impedance equal to the impedance of said first coupler.

5. A circuit according to claim 1, wherein the controllable resistance means is a diode.

6. A circuit according to claim 5, wherein said second coupler has an impedance equal to the impedance of said first coupler.

7. A circuit for the variable attenuation of microwave signals, comprising:

a first coupler;

a second coupler;

a first series circuit of inductors, each inductor having a defined inductance, where one end of said first series circuit is connected to a first terminal of said first coupler, and the other end of said first series circuit is connected to a first terminal of said second coupler;

a second series circuit of inductors, each inductor having a defined inductance, where one end of said second series circuit is connected to a second terminal of said first coupler, and the other end of said second series circuit is connected to a second terminal of said second coupler;

a plurality of controllable resistance means, each being connected to a junction point between two respective inductors of said first or second series circuit; and inductors at the ends of said first and second series circuits having a predetermined inductance represented as L, the remaining inductors having an inductance 2L, and said first and second series circuits satisfying $Z_0^2 = 2L/C$, where the characteristic impedance of said first coupler is represented as $Z_0$, and the capacity of said controllable resistance means is represented as C, wherein each of the first and second series circuits include two inductors of equal inductance represented as L.

8. A circuit according to claim 7, wherein said second coupler has an impedance equal to the impedance of said first coupler.

9. A circuit according to claim 7, wherein said controllable resistance means is a field-effect-transistor.

10. A circuit according to claim 9, wherein said second coupler has an impedance equal to the impedance of said first coupler.

11. A circuit according to claim 7, wherein the controllable resistance means is a diode.

12. A circuit according to claim 11, wherein said second coupler has an impedance equal to the impedance of said first coupler.

* * * * *